United States Patent
Chung et al.

(10) Patent No.: US 9,755,429 B2
(45) Date of Patent: Sep. 5, 2017

(54) CIRCUIT AND METHOD FOR INCREASING INDUCTOR CURRENT

(71) Applicant: TAIWAN SEMICONDUCTOR MANUFACTURING COMPANY, LTD., Hsinchu (TW)

(72) Inventors: Tao Wen Chung, San Jose, CA (US); Chan-Hong Chern, Palo Alto, CA (US); Ming-Chieh Huang, San Jose, CA (US); Chih-Chang Lin, San Jose, CA (US); Yuwen Swei, Fremont, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 111 days.

(21) Appl. No.: 14/943,673

(22) Filed: Nov. 17, 2015

(65) Prior Publication Data

US 2016/0072279 A1    Mar. 10, 2016

Related U.S. Application Data

(63) Continuation of application No. 14/100,164, filed on Dec. 9, 2013, now Pat. No. 9,214,805, which is a continuation of application No. 13/293,853, filed on Nov. 10, 2011, now Pat. No. 8,625,240.

(51) Int. Cl.
| | | |
|---|---|---|
| *H02H 9/00* | (2006.01) | |
| *H02H 9/04* | (2006.01) | |
| *H03K 3/356* | (2006.01) | |
| *H03K 19/0185* | (2006.01) | |
| *H01L 23/60* | (2006.01) | |
| *H01L 27/02* | (2006.01) | |
| *H03G 1/00* | (2006.01) | |

(52) U.S. Cl.
CPC .......... *H02H 9/04* (2013.01); *H03K 3/35613* (2013.01); *H03K 19/018514* (2013.01); *H01L 23/60* (2013.01); *H01L 27/0248* (2013.01); *H01L 2924/0002* (2013.01); *H03F 2200/294* (2013.01); *H03F 2203/45638* (2013.01); *H03G 1/0023* (2013.01)

(58) Field of Classification Search
USPC ..................................... 330/253, 254; 361/56
See application file for complete search history.

(56) References Cited

U.S. PATENT DOCUMENTS

| | | |
|---|---|---|
| 6,559,693 B2 | 5/2003 | Tung et al. |
| 7,215,194 B2 | 5/2007 | Kucharski et al. |
| 7,579,881 B2 | 8/2009 | Bach |
| 2009/0212861 A1* | 8/2009 | Lim ...................... H03F 1/3211 330/253 |

(Continued)

*Primary Examiner* — Danny Nguyen
(74) *Attorney, Agent, or Firm* — Hauptman Ham, LLP

(57) ABSTRACT

A method of increasing a current flowing through an inductor includes receiving an input signal with a driver stage, the driver stage including the inductor coupled in series with a loading between an output node of the driver stage and a power line. In response to a transition in the input signal from a first voltage state to a second voltage state, a first current flowing through the loading and the inductor is increased. During the transition in the input signal, the current flowing through the inductor is increased by increasing a second current in a circuitry though a node between the inductor and the loading.

20 Claims, 3 Drawing Sheets

(56) References Cited

U.S. PATENT DOCUMENTS

2010/0253436 A1    10/2010  Kanda et al.
2012/0242377 A1     9/2012  Yeung et al.
2012/0307931 A1*   12/2012  Johnson ................ H04L 25/026
                                                            375/295

* cited by examiner

CIRCUIT AND METHOD FOR INCREASING INDUCTOR CURRENT

PRIORITY CLAIM

The present application is a continuation of U.S. application Ser. No. 14/100,164, filed Dec. 9, 2013, which is a continuation of U.S. application Ser. No. 13/293,853, filed Nov. 10, 2011, now U.S. Pat. No. 8,625,240, issued Jan. 7, 2014, which are incorporated by reference herein in their entireties.

TECHNICAL FIELD

The present disclosure relates generally to the field of semiconductor devices, and more particularly, to input/output (I/O) circuits with inductors.

BACKGROUND

As semiconductor technology develops, integrated circuits often contain devices operating at a high voltage level, and other devices operating at a low voltage level. The low voltage devices cannot tolerate a high voltage signal. Device failures happen frequently, when the low voltage devices operate with the high voltage signal. In order to protect the low voltage devices from the high voltage signals, the integrated circuit often includes an input/output (I/O) circuit as an interface between the low voltage devices and the high voltage devices. The I/O circuit allows the low voltage devices to communicate with the high voltage devices, while protecting the low voltage devices from being damaged by the high voltage signals.

BRIEF DESCRIPTION OF THE DRAWINGS

Aspects of the present disclosure may be understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
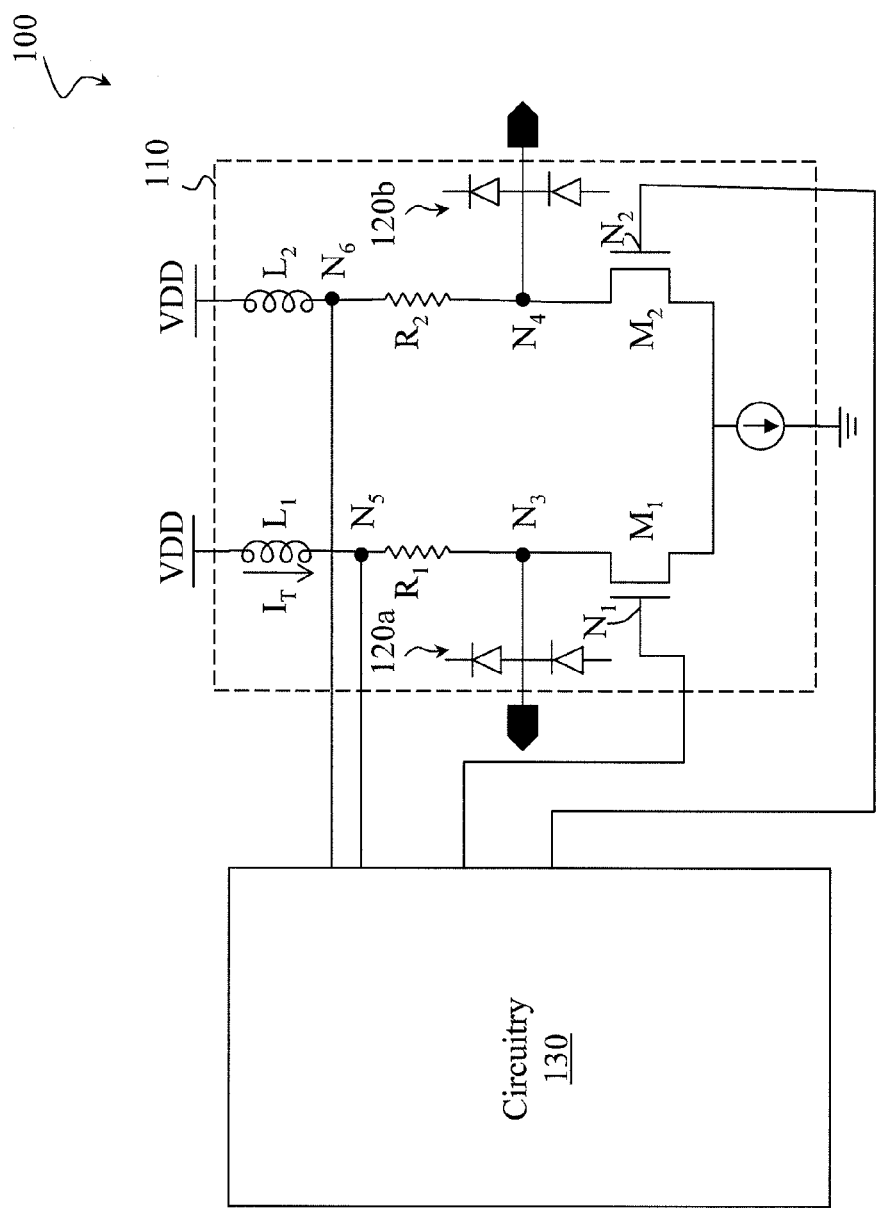
FIG. 1 is a schematic drawing of an input/output (I/O) circuit according to some embodiments.

An input/output (I/O) design has a bandwidth of about 8 gigahertz (GHz) or less. The bandwidth of this I/O design is compromised by high parasitic capacitances of electrostatic discharge (ESD) protection circuits that are added to output nodes of the I/O. In some instances, the parasitic capacitances of the ESD protection circuits are reduced. However, the parasitic capacitances cannot be reduced in designing some high bandwidth I/Os.

During designing an I/O accommodating a bandwidth of about 10 GHz or more, an inductive peaking technique uses a pair of inductors, each of which is electrically coupled between a loading resistor and a supply voltage VDD. In some instances, the inductance of the inductor may be around 0.3 nanohenries (nH) for a design with a 40-nm technology node or smaller.

As the technology node of integrated circuits shrinks, an area available for an I/O design becomes smaller. In some embodiments, the design of the 0.3-nH inductors for inductive peaking may be too large to fit into a single I/O pitch. The large inductors and the small I/O pitch make the I/O design challenging for the small technology node.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing of an input/output (I/O) circuit. In FIG. 1, an I/O circuit 100 includes a driver stage 110 that is electrically coupled with a circuitry 130. The driver stage 110 includes at least one input node, e.g., input nodes $N_1$ and $N_2$, and at least one output node, e.g., output nodes $N_3$ and $N_4$. The input nodes $N_1$ and $N_2$ are electrically coupled with gates of transistors $M_1$ and $M_2$ of the driver stage 110, respectively. Drains of the transistors $M_1$ and $M_2$ each are electrically coupled with the respective output nodes $N_3$ and $N_4$. In FIG. 1, the output nodes $N_3$ and $N_4$ of the driver stage 110 are the output nodes of the I/O circuit 100.

In some embodiments, the driver stage 110 includes at least one electrostatic discharge (ESD) protection circuit, e.g., ESD protection circuits 120a and 120b, which are electrically coupled with the respective output nodes $N_3$ and $N_4$ of the I/O circuit 100. The ESD protection circuits 120a and 120b are configured to protect the I/O circuit 100 from being damaged by a momentary electrostatic discharge event that happens to the output nodes $N_3$ and $N_4$. In some embodiments, the ESD protection circuits 120a and 120b each have a parasitic capacitance of about 400 femtofarads (fF) or more.

Referring to FIG. 1, the I/O circuit 100 includes at least one inductor, e.g., inductors $L_1$ and $L_2$, which are electrically coupled with respective loadings, e.g., resistors $R_1$ and $R_2$ in a series fashion. The inductor $L_1$ and the resistor $R_1$ are electrically coupled between the output node $N_3$ and a power line that is configured to provide a supply voltage VDD. The inductor $L_2$ and the resistor $R_2$ are electrically coupled between the output node $N_4$ and the power line that is configured to provide a supply voltage VDD. In some embodiments, the supply voltage VDD is about 1.8 V, the inductance of each inductor is about 0.1 nanohenry (nH) or less, and the resistance of each resistor is about 50 ohm ($\Omega$). As the inductance of each inductor is low, the area used by the inductor design is small such that the inductors 120a and 120b can be designed in a single I/O pitch. In some embodiments, the I/O pitch is about 30 µm or less.

It is noted that the inductance, parasitic capacitance, supply voltage and/or resistance described above in conjunction with FIG. 1 are merely exemplary. The scope of this application is not limited thereto. In some embodiments, the inductance, parasitic capacitance, supply voltage and/or resistance may be modified in response to a change of the technology node, the bandwidth design of the I/O circuit and/or other design changes.

Referring again to FIG. 1, the circuitry 130 is operable to increase a current $I_T$ flowing through the inductor $L_1$ or $L_2$ during a signal transition. For example, a pair of signals having opposite voltage states are applied to the input nodes $N_1$ and $N_2$. The signals turn off and on the respective transistors $M_1$ and $M_2$, such that a current is flowing through the inductor $L_2$.

During the signal transition, the signal applied to the input node $N_1$ turns on the transistor $M_1$ and another signal that applied to the input node $N_2$ turns off the transistor $M_2$. As the current $I_T$ flowing through the inductor $L_1$ is increased and/or induced by the circuitry 130, a portion of the current $I_T$ flows through the resistor $R_1$ and the remaining portion of the current $I_T$ flows through the circuitry 130. Even if the inductance of the inductor $L_1$ is small, e.g., about 0.1 nH or less, the voltage differential across the inductor $L_1$ is increased due to the increase of the current $I_T$. The pull-up of the voltage level on the node $N_3$ becomes fast. By increasing the current $I_T$, not only can the bandwidth of the I/O circuit 100 be increased, but also the small inductor $L_1$ can be designed in a single I/O pitch.

Figure 2:
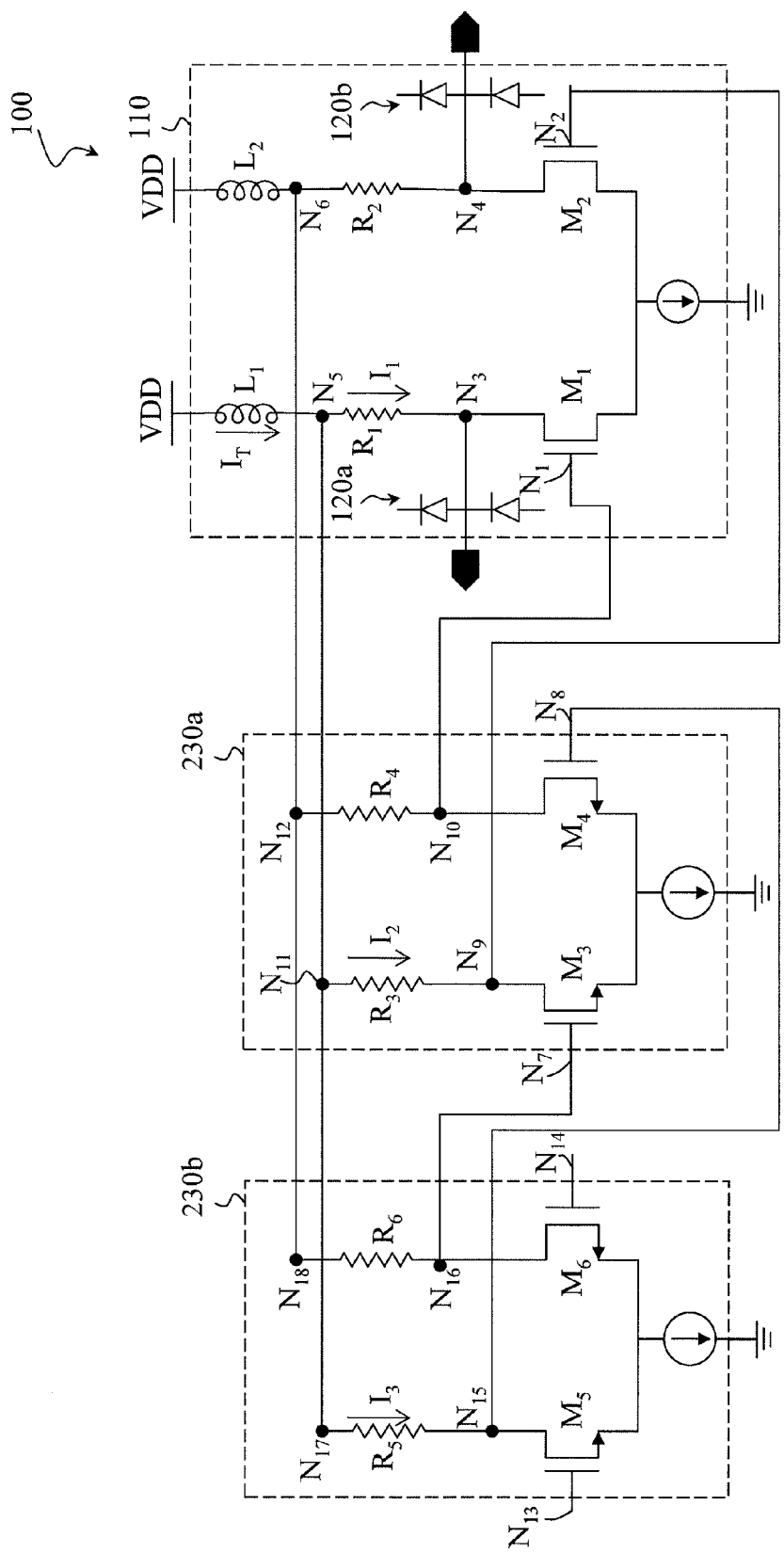
FIG. 2 is a schematic drawing illustrating an exemplary I/O circuit including at least one pre-driver stage according to some embodiments.

FIG. 2 is a schematic drawing illustrating an exemplary I/O circuit including at least one pre-driver stage. The at least one pre-driver stage is operable to generate pre-driver signals applied to the input nodes $N_1$ and $N_2$ of the driver stage 110. The at least one pre-driver stage is also operable to increase and/or induce the current $I_T$ flowing through the inductors $L_1$ and $L_2$.

In some embodiments, the circuitry 130 includes at least one pre-driver stage, e.g., pre-driver stages 230a and 230b. The pre-driver stages 230a and 230b each include respective input nodes $N_7$-$N_8$ and $N_{13}$-$N_{14}$, and respective output nodes $N_9$-$N_{10}$ and $N_{15}$-$N_{16}$. The pre-driver stages 230a and 230b each also include respective transistor pairs $M_3$-$M_4$ and $M_5$-$M_6$. Gates of the transistors $M_3$-$M_6$ each are electrically coupled with the respective input nodes $N_7$, $N_8$, $N_{13}$ and $N_{14}$. The output nodes $N_9$, $N_{10}$, $N_{15}$ and $N_{16}$ are electrically coupled with the respective input nodes $N_2$, $N_1$, $N_8$ and $N_7$.

Referring again to FIG. 2, the pre-driver stages 230a and 230b include respective resistor pairs $R_3$-$R_4$ and $R_5$-$R_6$. In some embodiments, the pre-driver stages 230a and 230b are electrically coupled with the node $N_5$ between the inductor $L_1$ and the resistor $R_1$ and the node $N_6$ between the inductor $L_2$ and the resistor $R_2$. For example, nodes $N_{11}$ and $N_{17}$ of the pre-driver stages 230a and 230b, respectively, are electrically coupled with the node $N_5$. Nodes $N_{12}$ and $N_{18}$ of the pre-driver stages 230a and 230b, respectively, are electrically coupled with the node $N_6$.

As noted, during the signal transition the current $I_T$ flowing through the inductor $L_1$ of the driver stage 110 is increased. If the nodes $N_{11}$ and $N_{17}$, and $N_{12}$ and $N_{18}$ were not electrically coupled with the respective nodes $N_5$ and $N_6$, the current $I_T$ would have been substantially equal to a current $I_1$ flowing through the resistor $R_1$. In FIG. 2, as the nodes $N_{11}$ and $N_{17}$, and $N_{12}$ and $N_{18}$ are electrically coupled with the respective nodes $N_5$ and $N_6$, the current $I_T$ is substantially equal to the sum of currents $I_1$, $I_2$ and $I_3$ that flow through the resistors $R_1$, $R_3$ and $R_5$ of the driver stage 110 and pre-driver stages 230a and 230b, respectively. In some embodiments, the currents $I_1$, $I_2$ and $I_3$ are substantially equal to each other. In some embodiments, the term "equal" here means that the currents $I_1$, $I_2$ and $I_3$ have the same frequency, phase and/or amplitude.

It is noted that the number of the pre-driver stages 230a and 230b described above in conjunction with FIG. 2 is merely exemplary. The scope of this application is not limited thereto. In some embodiments, a single pre-driver stage or more than two pre-driver stages are applied to increase and/or induce the current $I_T$. The number of the pre-driver stages may be changed in response to the design of the inductors, the differences of current phase and/or frequency of the currents flowing through the respective driver stages, and/or other design of the I/O circuit.

Figure 3:
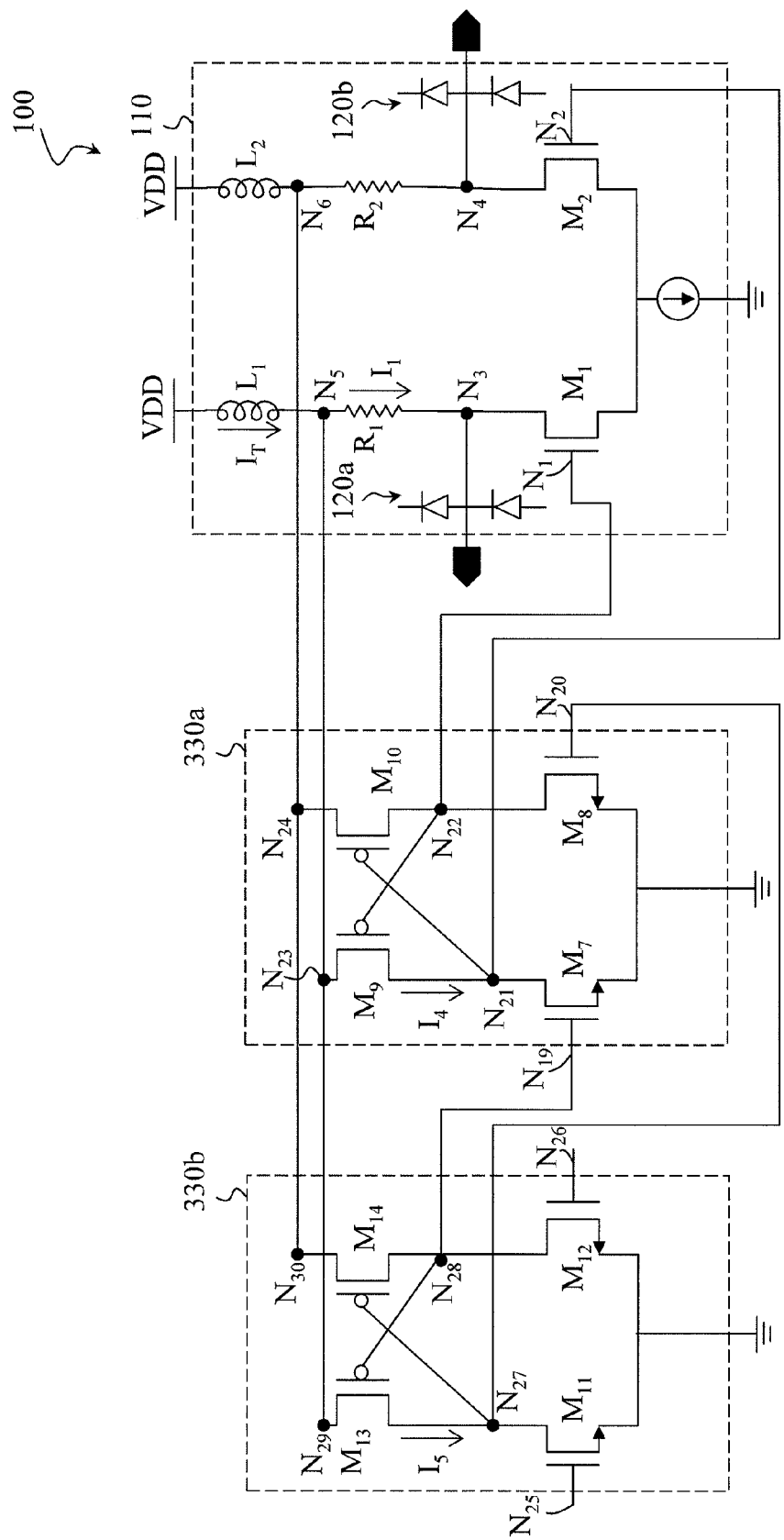
FIG. 3 is a schematic drawing illustrating an exemplary I/O circuit including at least one level shifter according to some embodiments.

FIG. 3 is a schematic drawing illustrating an exemplary I/O circuit including at least one level shifter. The at least one level shifter is operable to shift voltage stages of signals applied to the input nodes $N_1$ and $N_2$ of the driver stage 110. The at least one level shifter is also operable to increase and/or induce the current $I_T$ flowing through the inductors $L_1$ and $L_2$.

In some embodiments, the circuitry 130 includes at least one level shifter, e.g., level shifters 330a and 330b. The level shifters 330a and 330b each include respective input nodes $N_{19}$-$N_{20}$ and $N_{25}$-$N_{26}$, and respective output nodes $N_{21}$-$N_{22}$ and $N_{27}$-$N_{28}$. The level shifters 330a and 330b each also include respective transistors $M_7$-$M_{10}$ and $M_{11}$-$M_{14}$. In some embodiments, the transistors $M_7$-$M_8$ and $M_{11}$-$M_{12}$ are N-type transistors and the transistors $M_9$-$M_{10}$ and $M_{13}$-$M_{14}$ are P-type transistors. Gates of the transistors $M_7$-$M_8$ each are electrically coupled with the respective input nodes $N_{19}$ and $N_{20}$. The output nodes $N_{21}$-$N_{22}$ and $N_{27}$-$N_{28}$ are electrically coupled with the respective input nodes $N_2$, $N_1$, $N_{20}$ and $N_{19}$.

Referring to again FIG. 3, the output nodes $N_{21}$ and $N_{22}$ are disposed between the transistors $M_7$ and $M_9$ and between the transistors $M_8$ and $M_{10}$, respectively. The output nodes $N_{27}$ and $N_{28}$ are disposed between the transistors $M_{11}$ and $M_{13}$ and between the transistors $M_{12}$ and $M_{14}$, respectively. In some embodiments, the level shifters 330a and 330b are electrically coupled with the node $N_5$ between the inductor $L_1$ and the resistor $R_1$ and the node $N_6$ between the inductor $L_2$ and the resistor $R_2$. For example, nodes $N_{23}$ and $N_{29}$ are electrically coupled with the node $N_5$, and nodes $N_{24}$ and $N_{30}$ are electrically coupled with the node $N_6$.

As noted, during the signal transition the current $I_T$ flowing through in the inductor $L_1$ is increased. If the nodes $N_{23}$ and $N_{29}$ and $N_{24}$ and $N_{30}$ were not electrically coupled with the respective nodes $N_5$ and $N_6$, the current $I_T$ would have been equal to a current $I_1$ flowing through the resistor $R_1$. In FIG. 3, as the nodes $N_{23}$ and $N_{29}$, and $N_{24}$ and $N_{30}$ are electrically coupled with the respective nodes $N_5$ and $N_6$, the current $I_T$ is substantially equal to the sum of currents $I_1$, $I_4$ and $I_5$ flowing through the resistor $R_1$ and the transistors $M_9$ and $M_{13}$ of the driver stage 110 and level shifters 330a and 330b, respectively. In some embodiments, the currents $I_1$, $I_4$ and $I_5$ are substantially equal to each other. In some embodiments, the term "equal" here means that the currents $I_1$, $I_4$ and $I_5$ have the same frequency, phase and/or amplitude.

During the signal steady state, the currents flowing through the level shifters 330a and 330b are substantially equal to zero. The current $I_T$ flowing through in the inductor $L_1$ is substantially equal to the current $I_1$ that flows through the resistor $R_1$. Because no substantive current is flowing through the level shifters 330a and 330b during the signal steady state, the power consumed by the I/O circuit 100 is small.

It is noted that the number of the level shifters 330a and 330b described above in conjunction with FIG. 3 is merely exemplary. The scope of this application is not limited thereto. In some embodiments, a single level shifter or more than two level shifters are applied to increase and/or induce the current $I_T$. The number of the level shifters may be changed in response to the design of the inductors, the differences of current phase and/or frequency of the currents flowing in the respective level shifters, and/or other design of the I/O circuit.

In some embodiments, the level shifter 330a or 330b is replaced with the pre-driver stage 230a or 230b. In other embodiments, an additional driver stage is electrically coupled with the level shifters 330a and 330b in a parallel fashion to increase and/or induce the current $I_T$.

In some embodiments, a method of increasing a current flowing through an inductor comprises receiving an input signal with a driver stage, the driver stage comprising the inductor coupled in series with a loading between an output node of the driver stage and a power line. In response to a transition in the input signal from a first voltage state to a second voltage state, a first current flowing through the loading and the inductor is increased. During the transition in the input signal, the current flowing through the inductor is increased by increasing a second current in a circuitry though a node between the inductor and the loading.

In some embodiments, method of increasing a current flowing through an inductor comprises receiving an input signal with a first pre-driver stage at a first input node of the first pre-driver stage, generating a pre-driver signal with the first pre-driver stage based on the input signal, and receiving the pre-driver signal with a driver stage, the driver stage comprising the inductor coupled in series with a loading between an output node of the driver stage and a power line. In response to a transition in the input signal from a first voltage state to a second voltage state, the current flowing through the inductor is increased by increasing a first current flowing through the loading, and increasing a second current in the first pre-driver stage though a node between the inductor and the loading.

In some embodiments, a method of increasing a current flowing through an inductor comprises receiving an input signal with a first level shifter at a first input node of the first level shifter, generating a shifted signal with the first level shifter based on the input signal, and receiving the shifted signal with a driver stage, the driver stage comprising the inductor coupled in series with a loading between an output node of the driver stage and a power line. In response to a transition in the input signal, the current flowing through the inductor is increased by increasing a first current flowing through the loading, and increasing a second current in the first level shifter though a node between the inductor and the loading.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of increasing a current flowing through an inductor, the method comprising:
   receiving an input signal with a driver stage, the driver stage comprising the inductor coupled in series with a loading between an output node of the driver stage and a power line; and
   in response to a transition in the input signal from a first voltage state to a second voltage state, increasing a first current flowing through the loading and the inductor; and
   during the transition in the input signal, increasing the current flowing through the inductor by increasing a second current in a circuitry though a node between the inductor and the loading.

2. The method of claim 1, wherein increasing the first current flowing through the loading and the inductor comprises turning on a transistor coupled in series with the loading and the inductor.

3. The method of claim 1, wherein increasing the second current in the circuitry comprises turning on a transistor in the circuitry.

4. The method of claim 1, wherein increasing the second current in the circuitry comprises increasing the second current flowing through a resistor in the circuitry.

5. The method of claim 1, further comprising generating the input signal with the circuitry.

6. The method of claim 1, wherein increasing the second current in the circuitry comprises increasing the second current in a pre-driver stage.

7. The method of claim 1, wherein increasing the second current in the circuitry comprises increasing the second current in a level shifter.

8. The method of claim 1, wherein the driver stage further comprises an electrostatic discharge protection circuit coupled with the output node.

9. A method of increasing a current flowing through an inductor, the method comprising:
   receiving an input signal with a first pre-driver stage at a first input node of the first pre-driver stage;
   generating a pre-driver signal with the first pre-driver stage based on the input signal;
   receiving the pre-driver signal with a driver stage, the driver stage comprising the inductor coupled in series with a loading between an output node of the driver stage and a power line; and
   in response to a transition in the input signal from a first voltage state to a second voltage state, increasing the current flowing through the inductor by
   increasing a first current flowing through the loading, and
   increasing a second current in the first pre-driver stage though a node between the inductor and the loading.

10. The method of claim 9, wherein increasing the first current flowing through the loading comprises turning on a transistor coupled in series with the loading and the inductor.

11. The method of claim 9, wherein increasing the second current in the first pre-driver stage comprises turning on a transistor in the first pre-driver stage.

12. The method of claim 9, wherein increasing the second current in the first pre-driver stage comprises increasing the second current flowing through a resistor in the first pre-driver stage.

13. The method of claim 9, wherein increasing the current flowing through the inductor in response to the transition comprises increasing a third current in a second pre-driver stage or a level shifter.

14. The method of claim 9, wherein the driver stage further comprises an electrostatic discharge protection circuit coupled with the output node.

15. A method of increasing a current flowing through an inductor, the method comprising:
- receiving an input signal with a first level shifter at a first input node of the first level shifter;
- generating a shifted signal with the first level shifter based on the input signal;
- receiving the shifted signal with a driver stage, the driver stage comprising the inductor coupled in series with a loading between an output node of the driver stage and a power line; and
- in response to a transition in the input signal, increasing the current flowing through the inductor by
- increasing a first current flowing through the loading, and
- increasing a second current in the first level shifter though a node between the inductor and the loading.

16. The method of claim 15, wherein increasing the first current flowing through the loading comprises turning on a transistor coupled in series with the loading and the inductor.

17. The method of claim 15, wherein increasing the second current in the first level shifter comprises turning on a transistor in the first level shifter.

18. The method of claim 15, wherein
- the transition in the input signal comprises a transition in the input signal from a first voltage state to a second voltage state, and
- the method further comprises causing the second current in the level shifter to be substantially equal to zero while the input signal is in a steady state at the first voltage state or the second voltage state.

19. The method of claim 15, wherein increasing the current flowing through the inductor in response to the transition comprises increasing a third current in a second level shifter or a pre-driver stage.

20. The method of claim 15, wherein the driver stage further comprises an electrostatic discharge protection circuit coupled with the output node.

* * * * *